(12) United States Patent
Chang et al.

(10) Patent No.: US 8,709,901 B1
(45) Date of Patent: Apr. 29, 2014

(54) METHOD OF FORMING AN ISOLATION STRUCTURE

(71) Applicant: United Microelectronics Corp., Hsin-Chu (TW)

(72) Inventors: Chia-Lung Chang, Tainan (TW); Wu-Sian Sie, Tainan (TW); Jei-Ming Chen, Tainan (TW); Wen-Yi Teng, Kaohsiung (TW); Chih-Chien Liu, Taipei (TW); Jui-Min Lee, Taichung (TW); Chih-Hsun Lin, Ping-Tung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/864,277

(22) Filed: Apr. 17, 2013

(51) Int. Cl.
*H01L 21/336* (2006.01)

(52) U.S. Cl.
USPC ........... 438/296; 438/424; 438/426; 438/435; 438/437; 257/506; 257/510; 257/374; 257/E21.55; 257/E21.549

(58) Field of Classification Search
None
See application file for complete search history.

(56) References Cited

U.S. PATENT DOCUMENTS

| | | | |
|---|---|---|---|
| 6,043,138 A | 3/2000 | Ibok | |
| 6,468,853 B1 | 10/2002 | Balasubramanian | |
| 6,492,216 B1 | 12/2002 | Yeo | |
| 6,737,330 B2 * | 5/2004 | Park | 438/396 |
| 6,875,649 B2 * | 4/2005 | Oh et al. | 438/221 |
| 6,913,978 B1 * | 7/2005 | Chen et al. | 438/296 |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |

(Continued)

OTHER PUBLICATIONS

Chang et al., Title: Method for Forming Isolation Structure, pending U.S. Appl. No. 13/752,408, filed Jan. 29, 2013.

*Primary Examiner* — Telly Green
*Assistant Examiner* — Khanh Duong
(74) *Attorney, Agent, or Firm* — Winston Hsu; Scott Margo

(57) ABSTRACT

The present invention relates to a method of forming an isolation structure, in which, a trench is formed in a substrate through a hard mask, and deposition, etch back, deposition, planarization, and etch back are performed in the order to form an isolation material layer of the isolation structure after the hard mask is removed. A silicon layer may be formed to cover the trench and original surface of the substrate before the former deposition, or to cover a part of the trench and original surface of the substrate after the former etch back and before the later deposition, to serve as a stop layer for the planarization process. Voids existing within the isolation material layer can be exposed or removed by partially etching the isolation material layer by the former etch back. The later deposition can be performed with a less aspect ratio to avoid forming voids.

16 Claims, 7 Drawing Sheets

(56) References Cited

U.S. PATENT DOCUMENTS

| | | |
|---|---|---|
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |

* cited by examiner

METHOD OF FORMING AN ISOLATION STRUCTURE

BACKGROUND OF THE INVENTION

1. Field of the Invention

The present invention relates to a semiconductor fabricating process, and particularly to a method of forming an isolation structure.

2. Description of the Prior Art

Since the integrated circuit devices size evolves towards smaller dimensions with increased integration rates, distances and arrangements between devices within a semiconductor substrate are decreasing and become tighter. Therefore, suitable isolation has to be formed between two devices to avoid junction current leakage, and an isolation region has to be reduced in size in order to enhance integration with improved isolation. Among various isolation structures, shallow trench isolations (STIs) have the advantages of a relatively small isolation region, and are accordingly often employed. The conventional STI structure is formed between two metal oxide semiconductor (MOS) transistors and surrounds an active area in the semiconductor substrate to prevent carriers, such as electrons or electric holes, from drifting between two adjacent devices through the substrate which causes junction current leakage. STIs not only isolate such devices effectively but are also inexpensive, which suit semiconductor processes with high integration. Since small isolation regions are desired, trenches formed for forming the STIs are wanted to be narrow. One or more voids tend to be formed after the trench having a high-aspect-ratio profile is filled with isolation material using a high aspect ratio process (HARP). If the trench is filled using a flowable chemical vapor deposition process, the silicon substrate is often over-consumed, resulting in alteration of the active area size. The voids or the size alteration often affects the electric performance of the devices, especially fin field emission transistors (FinFET). Therefore, a novel method is still needed for forming an isolation structure having good qualities.

SUMMARY OF THE INVENTION

One objective of the present invention is to provide a method of forming an isolation structure to solve the aforesaid problem.

According to one embodiment of the present invention, a method of forming an isolation structure is provided. The method includes steps as follows. A hard mask is formed on a substrate. The substrate has an original surface. A trench is formed in the substrate through the hard mask. The hard mask is removed. After the hard mask is removed, a silicon layer is substantially conformally formed to cover the trench and the original surface of the substrate. The trench is filled with a first isolation material to form a first isolation material layer. A first etch process is performed to partially etch back the first isolation material layer to partially expose the trench. The trench is filled with a second isolation material together with the remaining first isolation material layer to form a second isolation material layer. A planarization process is performed and allowed to stop on the silicon layer on the original surface of the substrate.

According to another embodiment of the present invention, a method of forming an isolation structure is provided. The method includes steps as follows. A hard mask is formed on a substrate. The substrate has an original surface. A trench is formed in the substrate through the hard mask. The hard mask is removed. After the hard mask is removed, the trench is filled with a first isolation material to form a first isolation material layer. A first etch process is performed to partially etch back the first isolation material layer to partially expose the trench. A silicon layer is substantially conformally formed to cover the partially-exposed trench and the original surface of the substrate. After the silicon layer is formed, the trench is filled with a second isolation material to form a second isolation material layer. A planarization process is performed and allowed to stop on the silicon layer on the original surface of the substrate.

In the method of forming an isolation structure according to an embodiment of the present invention, there are advantaged as followed. A hard mask for trench formation has been removed before filling the trench with isolation material, so as to reduce the aspect ratio. Furthermore, the isolation material layer is formed in the trench through deposition, etch back, deposition again, and etch back again in the order. Because voids formed in the previous deposition can be exposed or removed in the former etch back, and in the latter deposition, the aspect ratio is smaller than that in the former deposition, so as to avoid formation of voids, an isolation material layer having good qualities can be obtained. Furthermore, the silicon layer is formed on the original surface of the substrate and serves as the etch stop for planarization process, such as chemical-mechanical polishing (CMP) process, such that the polishing may be more uniform.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
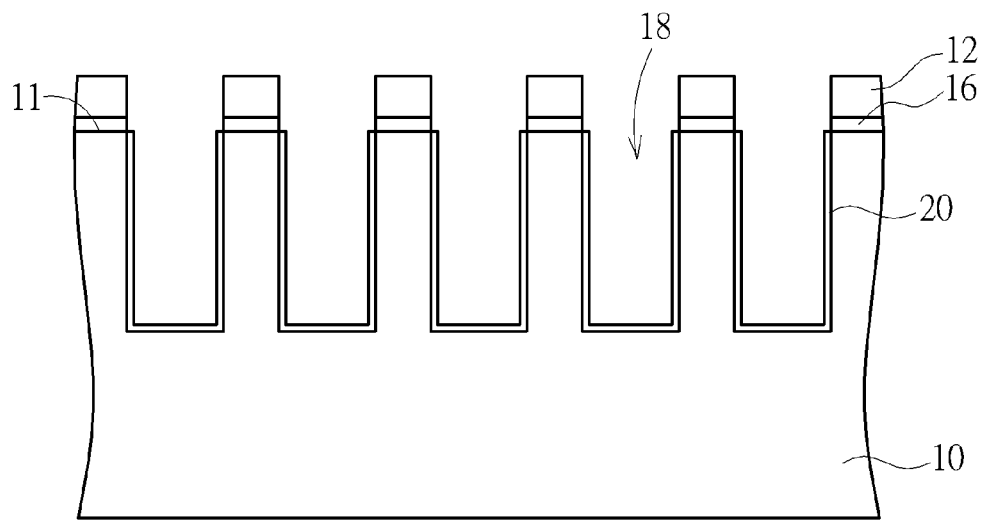
FIGS. 1 to 8 are schematic cross-sectional views illustrating the method of forming an isolation structure according to an embodiment of the present invention.

FIGS. 1 to 8 are schematic cross-sectional views illustrating the method of forming an isolation structure according to an embodiment of the present invention. As shown in FIG. 1, first, a hard mask 12 is formed on a substrate 10. The substrate 10 has an original surface 11. The substrate 10 may be, for example, a silicon substrate, a silicon-containing substrate, a III-V group-on-silicon (such as GaN-on-silicon) substrate, a graphene-on-silicon substrate, a silicon-on-insulator (SOI) substrate, or other semiconductor substrate. In this embodiment, the hard mask 12 may be formed using a silicon nitride layer, but not limited thereto. A pad oxide layer 16 may be formed between the silicon nitride layer and the substrate 10 to improve adhesion of the silicon nitride layer to the substrate 10, but the scope of the present invention is not limited thereto. Thereafter, an etch process is performed to pattern the silicon nitride layer and the pad oxide layer 16, so as to form the hard mask 12 with a pattern for defining the position of a trench to be formed in the substrate 110. Thereafter, an etch process is performed through the hard mask 12 to form at least a trench 18 in the substrate 10. The trench 18 may surround at least an active area. The drawings show that the trench 18 surrounds a plurality of active areas. The active area may be in any desired shape, such as a planar or fin shape. Thereafter, the hard mask 12 is removed. As shown in FIG. 1, an oxide liner 20 may be optionally formed in the trench 18. The oxide liner 20 may be formed simultaneously with the annealing performed on the trench 18. The oxide liner 20 may include a singular oxide layer or a multi-layer including stacked layers including an oxide layer and a silicon nitride layer. The formation of the oxide liner 20 may be performed before or after the removal of the hard mask 12.

Figure 2:
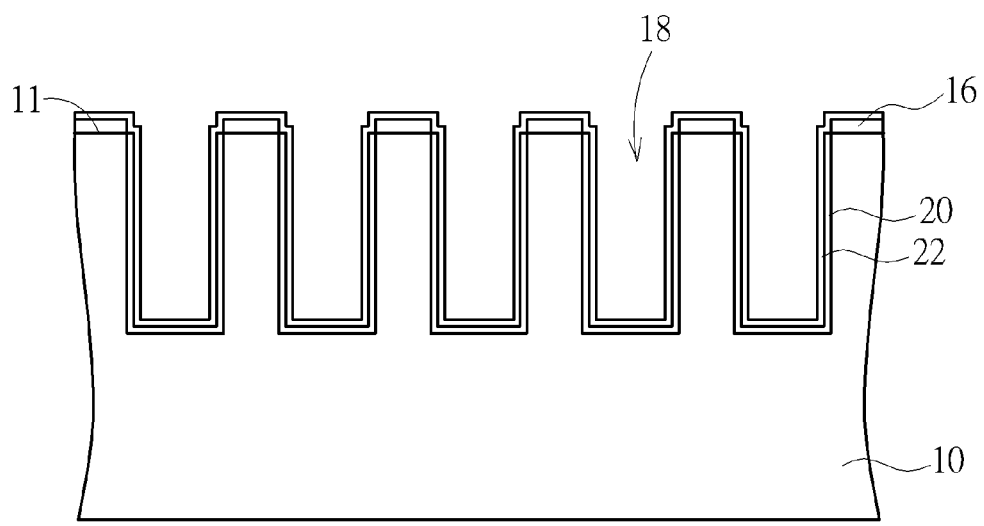

As shown in FIG. 2, after the hard mask 12 is removed, a silicon layer 22 is substantially conformally formed to cover the trench 18, i.e., to cover the sidewall and the bottom of the trench 18 and the original surface 11 of the substrate 10, and for example the pad oxide layer 16 above the original surface 11 if the pad oxide layer 16 is present. The silicon layer 22 may be formed through a chemical vapor deposition (CVD) process. The thickness of the silicon layer 22 may be for example 30 to 50 angstroms, but not limited thereto. Herein, the term "substantially conformally" means that the silicon layer formed on a surface has a surface shape conforms to or with the shape of the surface, but it is not necessary to have a same thickness therethroughout.

Figure 3:
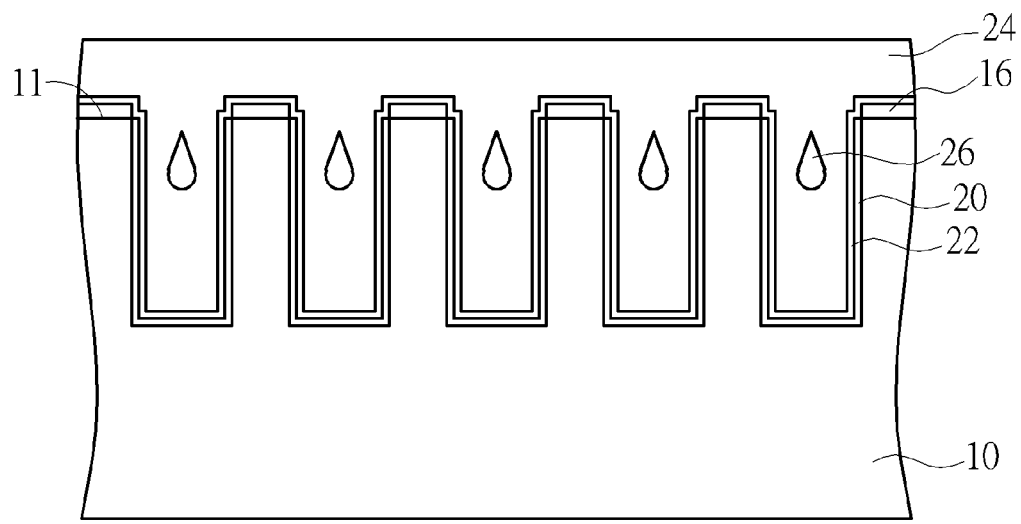

Thereafter, referring to FIG. 3, the trench 18 is filled with a first isolation material to form a first isolation material layer 24. The first isolation material may be material suitable used for forming a shallow trench isolation structure, for example, an oxide, but not limited thereto. The filling of the first isolation material may be performed through a chemical vapor deposition (CVD) process such as a high aspect ratio process (HARP), but it is not limited thereto. However, the first isolation material layer 24 formed through such process tends to have voids 26. In order to simplify the description of the present invention, only a portion of voids will be illustrated, but the number of voids may be more than the portion shown.

Figure 4:
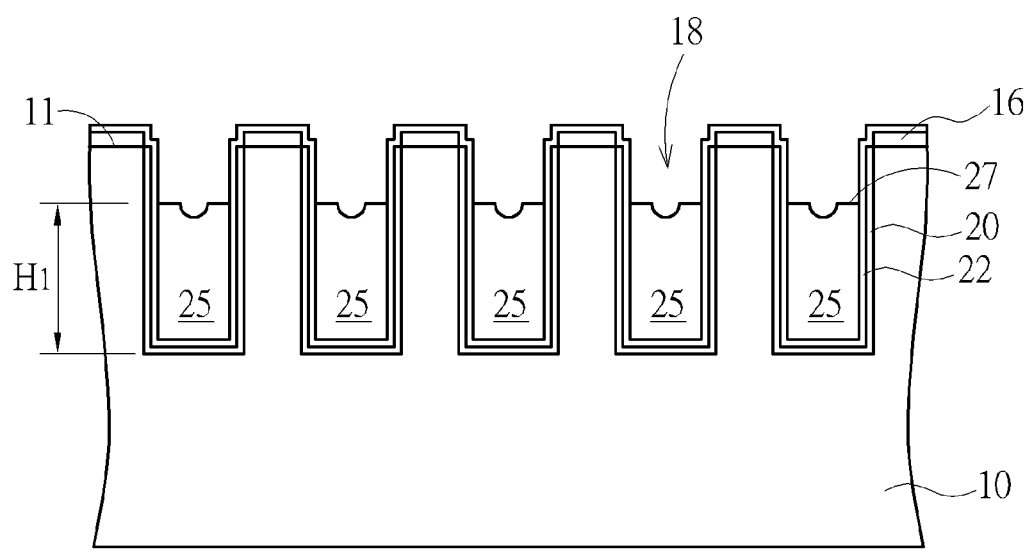

Thereafter, the first etch process is performed to etch back the first isolation material layer 24, so as to remove a portion of the first isolation material layer 24 and expose a portion of the trench 18, such as the upper portion. Hereinafter, the remaining first isolation material layer is denoted by the number 25, as shown in FIG. 4. The first etch process may include for example anisotropic dry etch or wet etch, but be not limited thereto. The etch rate for the first isolation material layer 24 is greater than the etch rate for the silicon layer in the first etch process. The depth for etching back the first isolation material layer 24 may be a depth which may allow the voids 26 to be exposed, or a depth which may even reach a position under the voids 26 so as to eliminate the voids 26. Even though the substantial positions (such as position in depth) of voids 26 in dense areas and in isolation areas may be different from each other, they may be determined or tested by methods such as electric microscopy, such as scanning electric microscopy (SEM) and transmission electric microscopy (TEM), carried out on specimens in advance. In this embodiment, the depth for etch back may be for example 200 nm to 300 nm, and, after etch back, the top surface 27 of the remaining first isolation material layer 25 is lower than the original surface 11 of the substrate 10 so as to expose voids 26, but not limited thereto.

Figure 5:
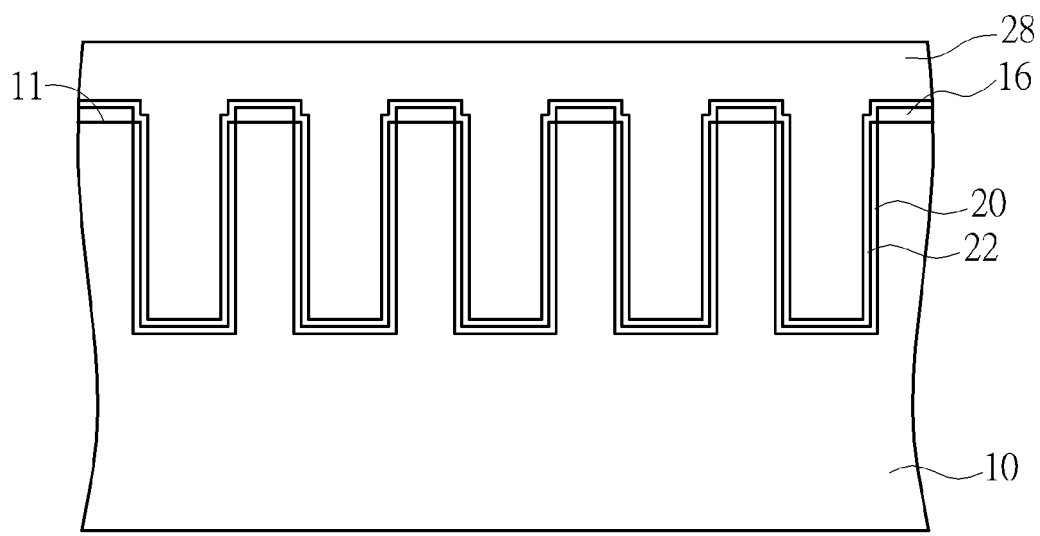

Thereafter, as shown in FIG. 5, the trench 18 is filled with a second isolation material together with the remaining first isolation material layer 25 to form a second isolation material layer 28. Because the depth of the remaining empty portion of the trench 18 is not deep for the second isolation material to fill, in other words, the remaining empty portion of the trench 18 has a relatively small aspect ratio in comparison with the trench 18 before filled with the first isolation material, a good trench filling may be easily attained, such that voids may not be formed within the second isolation material filled in the trench 18. In a preferred embodiment, the first isolation material and the second isolation material include the same material for tightly combining each other together to be integrated as a monolithic structure to form the second isolation material layer 28, but the scope of the present invention is not limited thereto.

Figure 6:
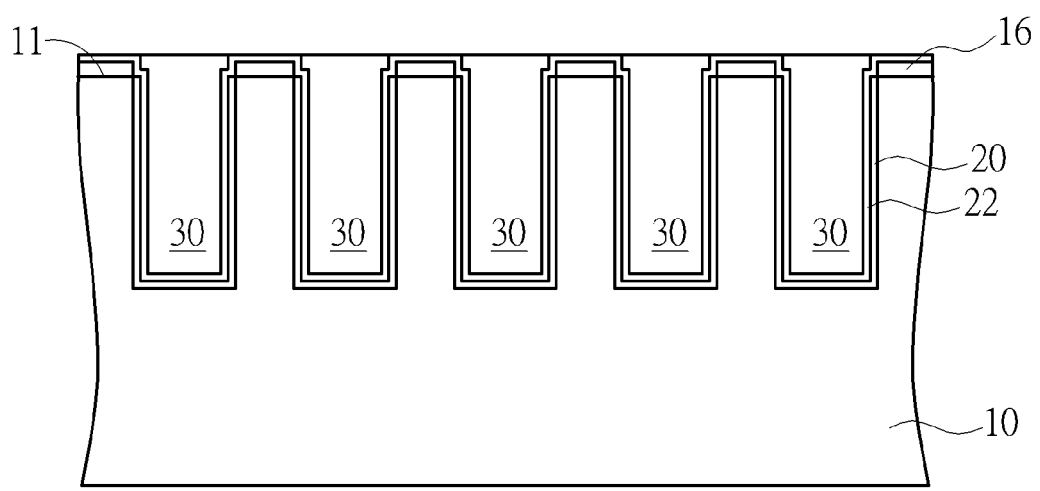

Thereafter, a planarization process, such as chemical-mechanical polishing (CMP) process, is performed to planarize the second isolation material layer 28 and allowed to stop on the silicon layer 22 above the original surface 11 of the substrate 10, as shown in FIG. 6. The silicon layer 22 serves as a stop layer. The CMP-processed second isolation material layer is denoted as the number 30. Because the polishing rate of the second isolation material layer 28 significantly differs from that of the silicon layer 22, a uniform polishing can be achieved.

Figure 7:
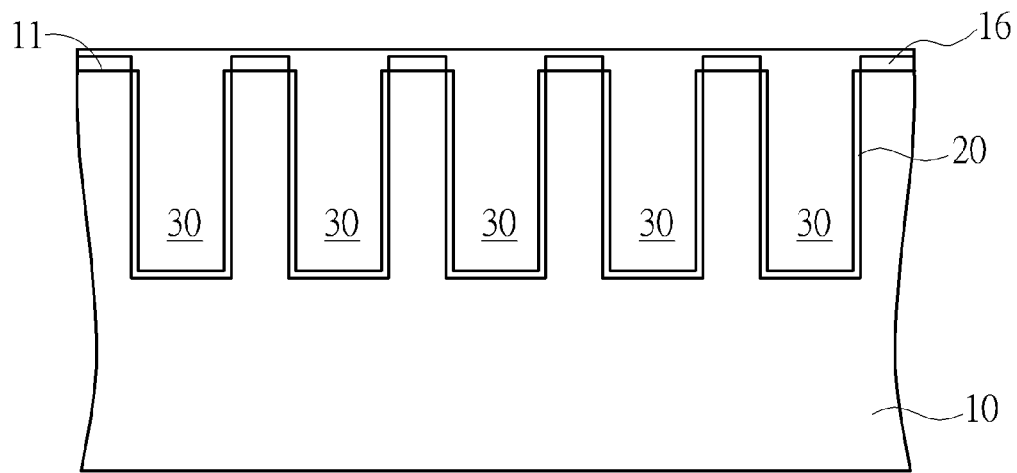

Thereafter, as shown in FIG. 7, the silicon layer 22 may be further oxidized to form silicon oxide, so as to be merged with the second isolation material layer together. The method for oxidizing the silicon layer 22 to form silicon oxide may include, for example, a two-stage temperature process. Specifically, for example, an oxidation process is performed on the silicon layer 22 in a steam environment at a relatively low temperature, such as 700° C., and an annealing process is performed on the resultant in an inert gas, such as nitrogen, atmosphere at a relatively high temperature, such as 1050° C., so as to allow the silicon layer 22 to turn into silicon oxide more completely, as well as to allow the first isolation material and the second isolation material to become more dense, but the scope of the present invention is not limited thereto. Furthermore, trace of the silicon layer 22 may remain within the trench 18, for example, on the sidewall or bottom of the trench 18, but this will not affect the electric performance of the devices.

Thereafter, a second etch process is performed to etch back the planarized second isolation material layer 30, so as to remove a portion of the second isolation material layer 30 to expose a portion of the trench 18 again, in other words, to expose a thickness of the substrate 10. In the second etch process, an oxide layer above the original surface 11 of the substrate 10 may be also removed to expose the original surface 11 of the substrate 10. The exposed substrate 10 may include one or more fin-shaped active areas for subsequent fabrication process for FinFET devices. The remaining second isolation material layer, denoted by the number 32, within the trench 18 serves for an isolation structure 34 to provide isolation function between the active areas.

It is worthwhile to note that the remaining height $H_1$ of the remaining first isolation material layer 25 after the first etch process is performed is preferably less than the remaining height $H_2$ of the remaining second isolation material layer 32 after the second etch process is performed. For example, when the etch back depth in the first etch back process is for example 200 nm to 300 nm, the exposed fin-shaped substrate 10 after the second etch back process is performed may have a thickness of, for example, less than 200 nm. Such that, the portion above the second isolation material layer 32 within the isolation structure 34 is the isolation material filled in the trench 18 in the later filling process and may has preferable properties.

Figure 9:
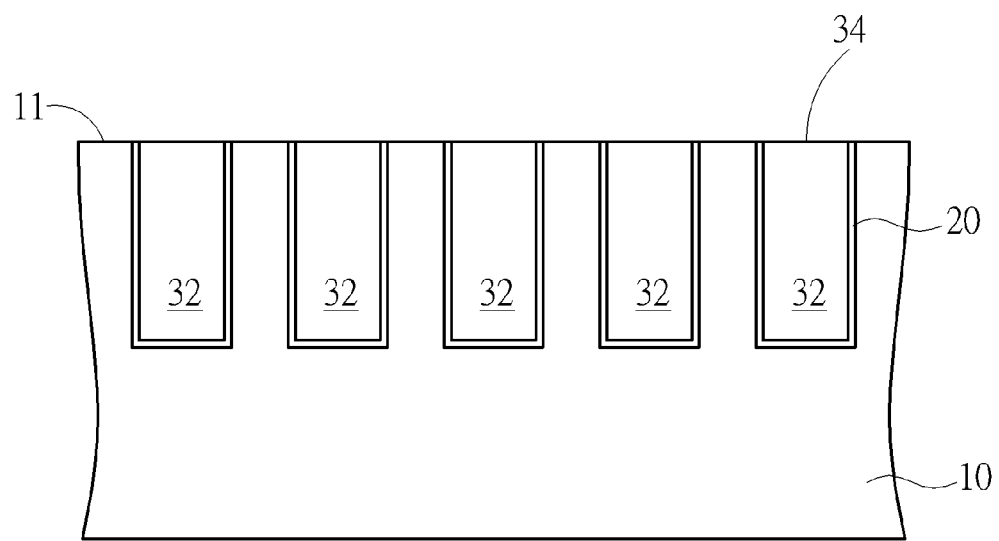
FIG. 9 is a schematic cross-sectional view illustrating the method of forming an isolation structure according to another embodiment of the present invention.

In the second embodiment, the steps are the same as or similar to those in the first embodiment and performed to result in a structure as shown in FIG. 7, but, thereafter, as shown in FIG. 9, when a second etch process is performed to etch back the planarized second isolation material layer 30, a portion of the second isolation material layer 30 may be removed until the original surface 11 of the substrate 10, such that the remaining second isolation material layer 30 is still fully filled in the trench 18 to mainly expose the original surface 11. Such that, the exposed substrate 10 may include one or more substantially planar active areas for later fabrication process for planar FET devices.

Figure 10:
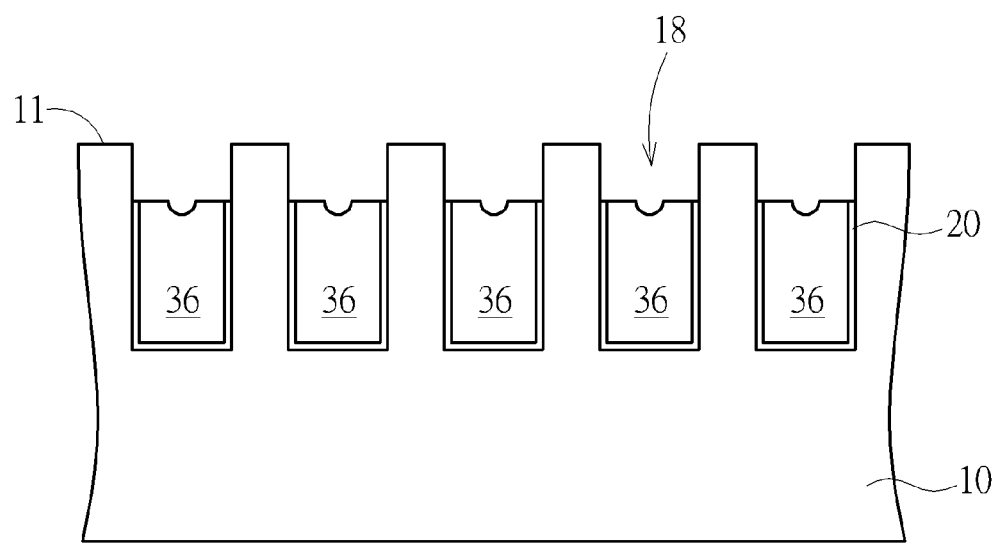
FIGS. 10 to 13 are schematic cross-sectional views illustrating the method of forming an isolation structure according to further another embodiment of the present invention.

FIGS. 10 to 13 are schematic cross-sectional views illustrating the method of forming an isolation structure according to the third embodiment of the present invention. Some of the steps are the same as or similar to those in the first embodiment, as shown in FIG. 1, as follows. A hard mask 12 is formed on a substrate 10. A trench 18 is formed in the substrate 10 through the hard mask 12. Thereafter, the hard mask 12 is removed. Differently from that in the first embodiment, the trench 18 is filled with a first isolation material to form a first isolation material layer after removal of the hard mask 12, as shown in FIG. 10. Optionally, an oxide liner 20, which may include for example an oxide layer or a multi-layer of stacked layers including an oxide layer and a silicon nitride layer, may be formed in the trench 18 before the first isolation material layer is formed within the trench 18. Thereafter, a first etch process is performed to partially etch back the first isolation material layer to expose a portion, such as an upper portion, of the trench 18. Herein, the remaining first isolation material layer is denoted by the number 36. Similar to the first embodiment, it is preferred that the depth for etching back the first isolation material layer may be deep enough to expose the voids 26 or even to reach a position under the voids 26 so as to eliminate the voids 26.

Figure 11:
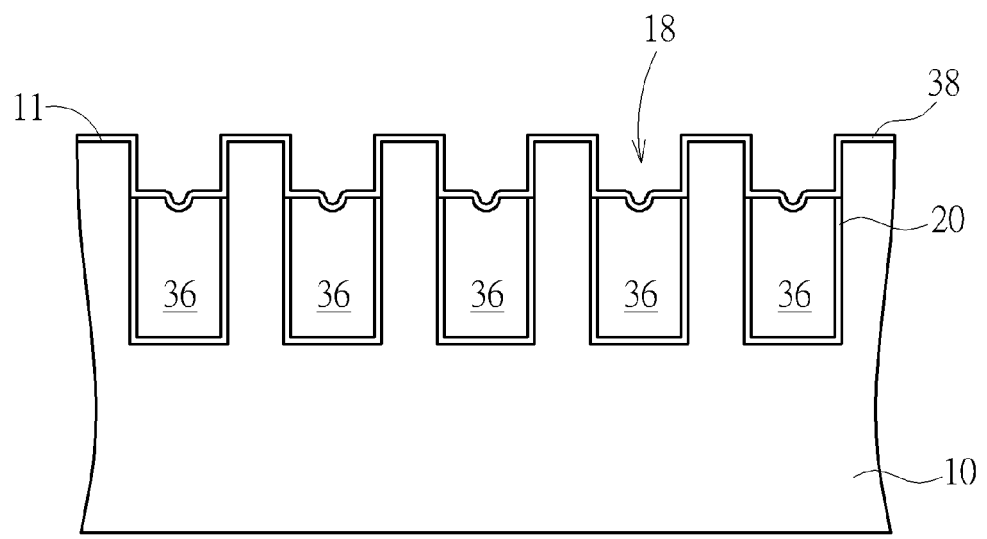

It is worthwhile to note that the difference between the third embodiment and the first embodiment includes steps, as shown in FIG. 11, described as follows. In the first embodiment, the silicon layer 22 is formed in the trench 18 before the first isolation material layer is formed in the trench 18. However, in this third embodiment, the silicon layer 38 is substantially conformally formed on the remaining first isolation material layer 36 after the first isolation material layer is formed and etched backed, and allowed to cover the partially-exposed trench 18 and the original surface 11 of the substrate 10. The formation of the silicon layer 38 may be performed by, for example, the process for forming the silicon layer 22 as described above. "To cover the partially-exposed trench 18" means to form on the sidewall of the partially-exposed trench 18 and the remaining first isolation material layer 36 within the partially-exposed trench 18.

Figure 12:
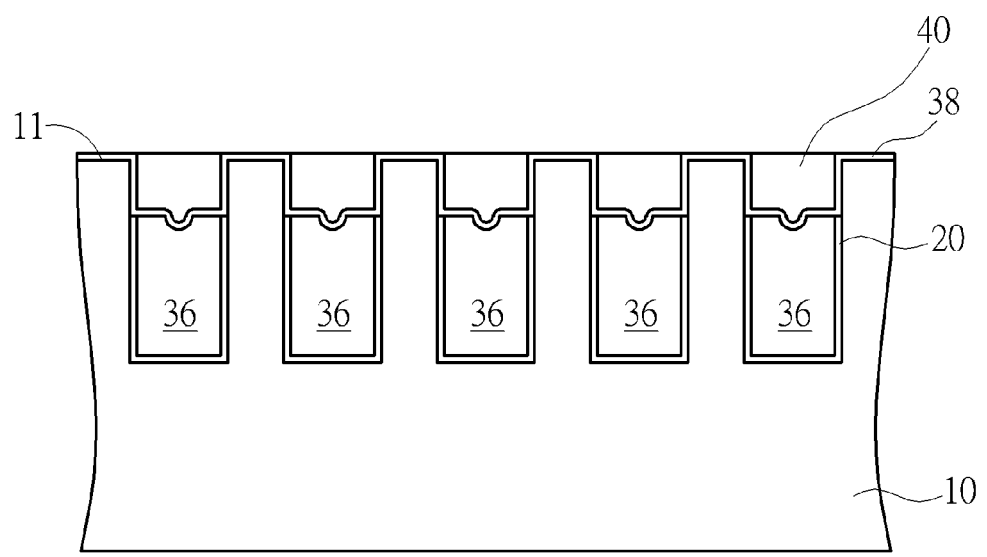

Thereafter, after the silicon layer 38 is formed, the trench 18 is filled with a second isolation material to form a second isolation material layer. A planarization process, such as chemical-mechanical polishing process, is performed and allowed to stop on the silicon layer 38 on the original surface 11 of the substrate 10, as shown in FIG. 12. The planarized, such as polished, second isolation material layer is denoted by the number 40.

Figure 13:
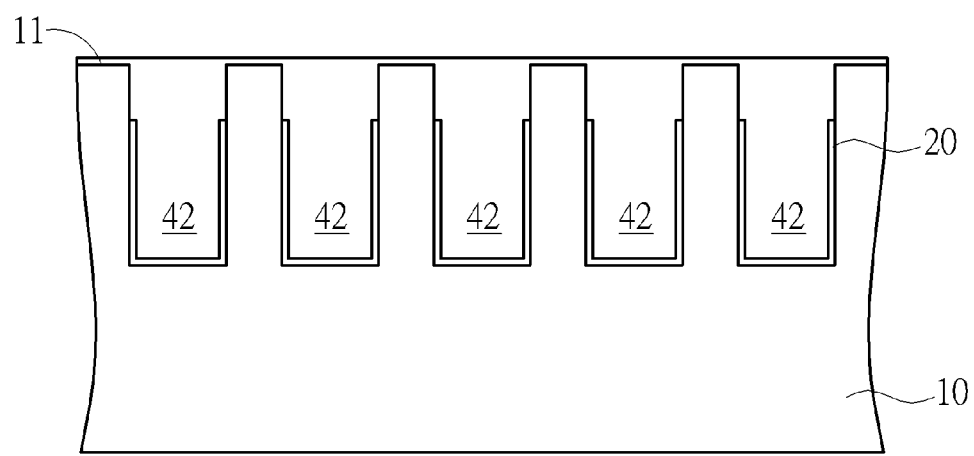

Thereafter, as shown in FIG. 13, the silicon layer 38 may be further oxidized to become silicon oxide to combine the planarized, such as polished, second isolation material layer 40 and the first isolation material layer 36 together to be one denoted by a third isolation material layer 42. The third isolation material layer 42 may further include other in addition to these three components 36, 38, and 40. The method for oxidizing the silicon layer 38 may be as described in the above for oxidizing the silicon layer 22. Because the silicon layer 38 is located in a relatively shallow position in this embodiment, it can be oxidized more completely in comparison with the oxidation of the silicon layer 22 described above. Trace of silicon layer 38 may also remain within the trench 18, but it will not affect the electric performance of the devices.

Figure 8:
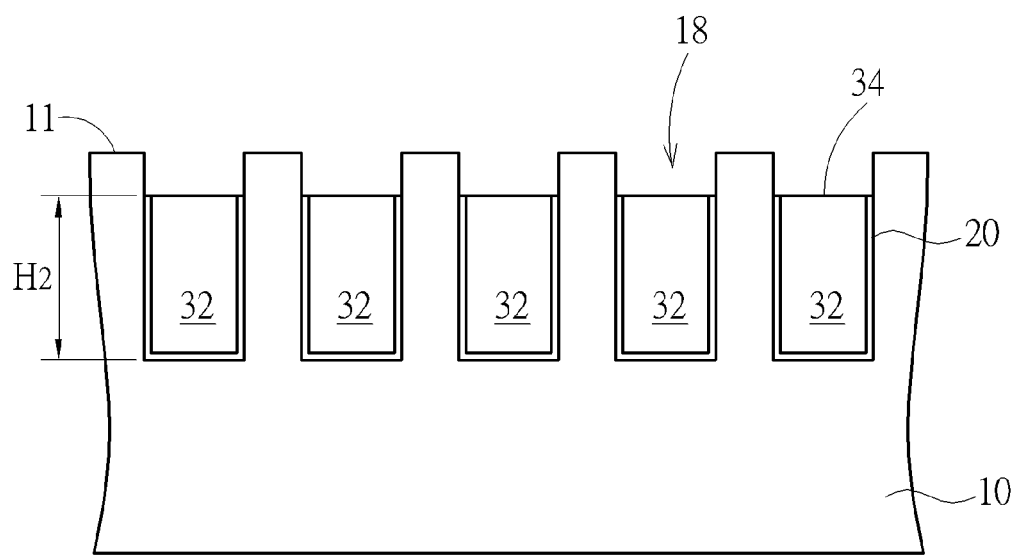

Thereafter, a second etch process may be further performed on the structure as shown in FIG. 13 to etch back the third isolation material layer 42 (i.e. including the planarized, such as polished, second isolation material layer 40) to partially expose the trench 18 again, and thus an isolation structure is formed, as well as that the substrate 10 with a predetermined height is exposed to give one or more fin-shaped active areas, similar to those shown in FIG. 8 illustrating the first embodiment, for fabricating one or more FinFET devices subsequently.

Alternatively, in the step of partially etching back the third isolation material layer 42 (i.e. including the planarized, such as polished, second isolation material layer 40) using the second etch process performed on the structure as shown in FIG. 13, the etch can be stopped on the original surface 11 of the substrate 10 to expose the original surface 11, similar to that shown in FIG. 9 illustrating the second embodiment, so as to allow the substrate 10 to serve for one or more planar active areas for fabricating one or more planar FET device subsequently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming an isolation structure, comprising:
   forming a hard mask on a substrate having an original surface;
   forming a trench in the substrate through the hard mask;
   removing the hard mask;
   after removing the hard mask, substantially conformally forming a silicon layer covering the trench and the original surface of the substrate;
   filling the trench with a first isolation material to form a first isolation material layer;
   performing a first etch process to partially etch back the first isolation material layer to partially expose the trench;
   filling the trench with a second isolation material together with the remaining first isolation material layer to form a second isolation material layer; and
   performing a planarization process stopping on the silicon layer on the original surface of the substrate.

2. The method according to claim 1, further, before forming the silicon layer, comprising:
   forming an oxide liner in the trench.

3. The method according to claim 1, further comprising: oxidizing the silicon layer to form silicon oxide.

4. The method according to claim 3, further comprising performing a second etch process to partially etch back the second isolation material layer to expose a thickness of the substrate.

5. The method according to claim 3, further comprising performing a second etch process to partially etch back the second isolation material layer to expose the original surface of the substrate.

6. The method according to claim 3, wherein oxidizing the silicon layer to form silicon oxide comprises:
   performing an oxidation process in a steam environment at a relatively low temperature; and
   performing an annealing process in a nitrogen atmosphere at a relatively high temperature.

7. The method according to claim 4, wherein the remaining first isolation material layer has a first remaining height after performing the first etch process, the remaining second isolation material layer has a second remaining height after performing the second etch process, and the first remaining height is less than the second remaining height.

8. The method according to claim 1, wherein the planarization process comprises a chemical-mechanical polishing process.

9. A method of forming an isolation structure, comprising:
   forming a hard mask on a substrate having an original surface;
   forming a trench in the substrate through the hard mask;
   removing the hard mask;
   after removing the hard mask;
   filling the trench with a first isolation material to form a first isolation material layer;
   performing a first etch process to partially etch back the first isolation material layer to partially expose the trench;
   substantially conformally forming a silicon layer covering the partially-exposed trench and the original surface of the substrate;
   after forming the silicon layer, filling the trench with a second isolation material to form a second isolation material layer; and
   performing a planarization process stopping on the silicon layer on the original surface of the substrate.

10. The method according to claim 9, further, before forming the silicon layer, comprising:
   forming an oxide liner in the trench.

11. The method according to claim 9, further comprising: oxidizing the silicon layer to form silicon oxide.

12. The method according to claim 11, further comprising performing a second etch process to partially etch back the second isolation material layer to expose a height of the substrate.

13. The method according to claim 11, further comprising performing a second etch process to partially etch back the second isolation material layer to expose the original surface of the substrate.

14. The method according to claim 11, wherein oxidizing the silicon layer to form silicon oxide comprises:
   performing an oxidation process in a steam environment at a relatively low temperature; and
   performing an annealing process in a nitrogen atmosphere at a relatively high temperature.

15. The method according to claim 12, wherein the remaining first isolation material layer has a first remaining height after performing the first etch process, a third isolation material layer has a second remaining height after performing the second etch process, the first remaining height is less than the second remaining height, and the third isolation material layer comprises the remaining first isolation material layer after performing the first etch process, silicon oxide resulted from oxidizing the silicon layer, the remaining second isolation material layer after performing the second etch process.

16. The method according to claim 9, wherein the planarization process comprises a chemical-mechanical polishing process.

* * * * *